United States Patent
Radu et al.

(10) Patent No.: US 10,276,492 B2
(45) Date of Patent: Apr. 30, 2019

(54) METHOD FOR FABRICATING SEMICONDUCTOR STRUCTURES INCLUDING A HIGH RESISTIVITY LAYER, AND RELATED SEMICONDUCTOR STRUCTURES

(71) Applicant: Soitec, Crolles (FR)

(72) Inventors: Ionut Radu, Crolles (FR); Eric Desbonnets, Lumbin (FR)

(73) Assignee: Soitec, Crolles (FR)

( * ) Notice: Subject to any disclaimer, the term of this patent is extended or adjusted under 35 U.S.C. 154(b) by 0 days.

(21) Appl. No.: 15/405,867

(22) Filed: Jan. 13, 2017

(65) Prior Publication Data

US 2017/0207164 A1 Jul. 20, 2017

(30) Foreign Application Priority Data

Jan. 15, 2016 (FR) .................................. 16 50333

(51) Int. Cl.
| | | |
|---|---|---|
| *H01L 23/48* | (2006.01) | |
| *H01L 23/522* | (2006.01) | |
| *H01L 21/768* | (2006.01) | |
| *H01L 23/528* | (2006.01) | |
| *H01L 23/66* | (2006.01) | |
| *H01L 21/762* | (2006.01) | |

(52) U.S. Cl.
CPC .... *H01L 23/5226* (2013.01); *H01L 21/76254* (2013.01); *H01L 21/76877* (2013.01); *H01L 23/528* (2013.01); *H01L 23/66* (2013.01); *H01L 2223/6616* (2013.01)

(58) Field of Classification Search
CPC ... H01L 23/66; H01L 23/4825; H01L 23/528; H01L 23/5226; H01L 21/76877; H01L 2223/6616; H01L 21/76254

USPC .............................................. 438/22, 48, 51
See application file for complete search history.

(56) References Cited

U.S. PATENT DOCUMENTS

| | | | | |
|---|---|---|---|---|
| 6,162,665 | A * | 12/2000 | Zommer | H01L 29/66333 |
| | | | | 148/DIG. 126 |
| 9,478,858 | B1 * | 10/2016 | West | G01S 13/953 |
| 2003/0203547 | A1 | 10/2003 | Sakaguchi et al. | |
| 2007/0018282 | A1 * | 1/2007 | Asakawa | H01L 23/485 |
| | | | | 257/531 |

(Continued)

FOREIGN PATENT DOCUMENTS

FR   2993398 A1   1/2014

OTHER PUBLICATIONS

European Search Report for European Application No. 17150341 dated May 19, 2017, 7 pages.

(Continued)

*Primary Examiner* — Brook Kebede
(74) *Attorney, Agent, or Firm* — TraskBritt (57) ABSTRACT

Methods of forming a semiconductor structure include forming a device layer on an initial substrate, attaching a first surface of the device layer to a temporary substrate and forming a high resistivity layer on a second surface of the device layer by removing a portion of the initial substrate. Methods further include attaching a final substrate to the high resistivity layer and removing the temporary substrate. Semiconductor structures are fabricated by such methods that include a final substrate, a high resistivity layer disposed over the final substrate and a device layer disposed over the high resistivity layer.

13 Claims, 6 Drawing Sheets

(56) References Cited

U.S. PATENT DOCUMENTS

| | | | |
|---|---|---|---|
| 2010/0019387 A1* | 1/2010 | Miura | H01L 23/3114 |
| | | | 257/773 |
| 2012/0037969 A1* | 2/2012 | Sanders | H01L 23/481 |
| | | | 257/296 |
| 2014/0001579 A1* | 1/2014 | Liu | G01L 9/0073 |
| | | | 257/415 |
| 2014/0002666 A1* | 1/2014 | Eden | G01J 5/0803 |
| | | | 348/164 |
| 2015/0371905 A1* | 12/2015 | Carroll | H01L 21/84 |
| | | | 257/351 |
| 2016/0023892 A1* | 1/2016 | Costa | B81B 7/0064 |
| | | | 257/607 |

OTHER PUBLICATIONS

French Search Report for French Application No. 1650333 dated Sep. 1, 2016, 2 pages.

\* cited by examiner

METHOD FOR FABRICATING SEMICONDUCTOR STRUCTURES INCLUDING A HIGH RESISTIVITY LAYER, AND RELATED SEMICONDUCTOR STRUCTURES

PRIORITY CLAIM

This application claims the benefit of the filing date of French Patent Application Serial No. 1650333, filed Jan. 15, 2016, for "Method for Fabricating Semiconductor Structures Including a High Resistivity Layer, and Related Semiconductor Structures."

TECHNICAL FIELD

Embodiments of the present disclosure relate to methods that may be used to fabricate semiconductor structures including a high resistivity layer, and to semiconductor structures and devices fabricated using such methods.

BACKGROUND

The performance of radio frequency (RF) electronic switching devices, such as RF CMOS devices, can depend upon the electrical resistivity of the substrate from which they are fabricated. Recently, advanced semiconductor-on-insulator (SeOI) substrates such as, for example, high resistivity silicon-on-insulator (HR-SOI) have been utilized to fabricate RF CMOS devices with enhanced performance. For example, RF devices fabricated from HR-SOI have been demonstrated with reduced RF losses.

Double (or dual) layer transfer (DLT) of an active layer of devices can allow for the replacement of an initial substrate with a final substrate that is better suited for providing improved RF performance of devices formed thereon.

Briefly, a device layer, for example, comprising a plurality of RF CMOS devices, may be fabricated in or on an initial substrate. The device layer may subsequently be attached to a temporary substrate. With the device layer attached to the temporary substrate, a portion of the initial substrate may be removed and replaced with a final substrate better suited to enhanced RF performance. Once the device layer is attached to the final substrate, the temporary substrate may be removed completing the DLT processing of the device layer. For example, DLT for RF CMOS has been demonstrated utilizing an initial SOI-type substrate.

When utilizing an initial SOI-type substrate, the bulk silicon carrier portion of the SOI-type substrate is completely removed during the DLT process, removing an unwanted low resistivity path, which may compromise RF performance. However, in the case of RF CMOS devices fabricated from a standard bulk substrate a residual thickness of the initial substrate may remain adjacent to the RF CMOS devices as a result of the fabrication process. The remaining residual thickness of the initial substrate may act as a low resistivity path resulting in RF losses and a reduction in the RF performance of the device layer.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes a method of fabricating a semiconductor structure. The method of forming a semiconductor structure may comprise:
forming a device layer on an initial substrate;
attaching a first surface of the device layer to a temporary substrate;
forming a high resistivity layer, wherein forming the high resistivity layer comprises removing a portion of the initial substrate, the high resistivity layer comprising a remaining portion of the initial substrate;
attaching a final substrate to the high resistivity layer; and
removing the temporary substrate.

According to further non-limiting features of the present disclosure, either taken alone or in any technically feasible combination:
removing a portion of the initial substrate comprises thinning a portion of the initial substrate;
removing a portion of the initial substrate comprises forming a plurality of vias extending through a remaining portion of the initial substrate;
forming a plurality of vias through a remaining portion of the initial substrate comprises: forming a masking layer over an exposed surface of the remaining portion of the initial substrate, and etching vias through the unmasked remaining portion of the initial substrate.
the masking layer comprises a plurality of masking elements and the method comprises selecting the total surface area of the plurality of masking elements to be less than seventy-five percent (75%) of the total surface area of the exposed surface of the remaining portion of the initial substrate;
attaching the final substrate to the high resistivity layer comprises attaching the final substrate to the plurality of vias forming a plurality of cavities between the final substrate and the device layer;
the method comprises forming a high resistivity material over the plurality of vias;
the method comprises selecting the high resistivity material to have an electrical resistivity greater than 10,000 Ohm·cm; and
the method comprises selecting the high resistivity material to comprise at least one of a silicon oxide, a silicon nitride, a high resistivity polymer, a polyimide, or a ceramic glue.

The present disclosure further includes a semiconductor structure comprising:
a final substrate;
a high resistivity layer disposed over the final substrate, the high resistivity layer comprising a remaining portion of an initial substrate;
a plurality of vias extending through the remaining portion; and
a radio frequency electronic device layer disposed over the high resistivity layer.

According to further non-limitative features of the present disclosure, either taken alone or in any technically feasible combination:
the high resistivity layer comprises a layer with an average electrical resistivity of greater than approximately 10,000 Ohm·cm;
the high resistivity layer comprises a remaining portion of the initial substrate and a plurality of cavities;
the high resistivity layer comprises a high resistivity material disposed between the plurality of vias;

the high resistivity material comprises one or more of a silicon oxide, a silicon nitride, a high resistivity polymer, a polyimide, or a ceramic glue; and the high resistivity material has a electrical resistivity greater than approximately 10,000 Ohm·cm.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

FIGS. 1A through 1H are simplified, schematically illustrated views illustrating fabrication of semiconductor structures and devices that may be employed in accordance with an embodiment of the present disclosure;

FIGS. 2A through 2D are simplified, schematically illustrated cross-sectional views illustrating fabrication of semiconductor structures and devices that may be employed in accordance with an another embodiment of the present disclosure;

DETAILED DESCRIPTION

The illustrations presented herein are not meant to be actual views of any particular semiconductor structure, device, system, or method, but are merely idealized representations that are used to describe embodiments of the present disclosure.

Any headings used herein should not be considered to limit the scope of embodiments of the invention as defined by the appended claims and their legal equivalents. Concepts described in any specific heading are generally applicable in other sections throughout the entire specification.

Figure 1A:
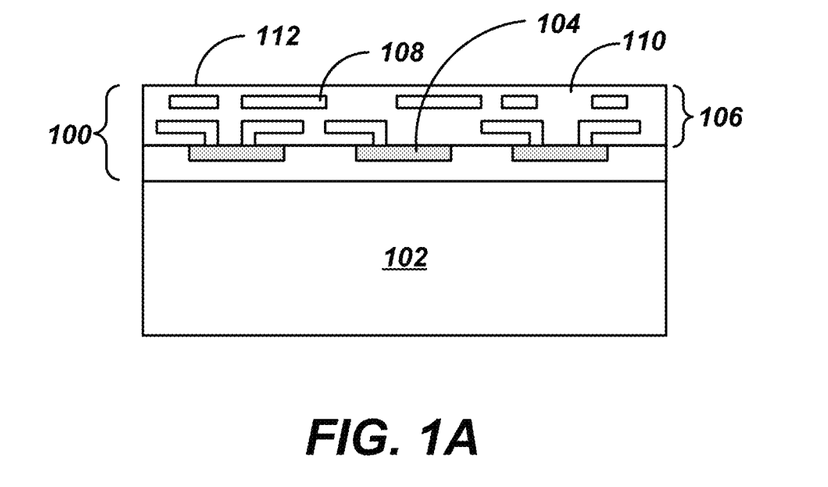
FIG. 1A illustrates an initial substrate that includes a device layer formed thereon.

An embodiment of the present disclosure is described with reference to FIGS. 1A through 1H. With reference to FIG. 1A, embodiments may comprise forming a device layer 100 on an initial substrate 102.

In greater detail, the device layer 100 may comprise a plurality of electronic devices 104. The electronic devices 104 may comprise switching devices as well as further electronic device types such as, for example, logic, light emitting and light receiving devices, transistors, etc. In certain embodiments, the plurality of electronic devices 104 may comprise a plurality of radio frequency devices, such as RF CMOS devices. The device layer 100 may also include an interconnection layer 106, which may comprise electrically conductive elements 108 disposed within an interlayer dielectric material 110. The plurality of electronic devices 104 may be formed on and/or in the initial substrate 102 using standard electronic fabrication methods, as known in the art.

Embodiments may comprise selecting the initial substrate 102 to comprise at least one of silicon, germanium, silicon germanium, silicon carbide, a III-V material or a II-VI material. Further embodiments may comprise selecting the initial substrate to exhibit a resistivity of between about 5 Ohm·cm and about 30 Ohm·cm. The initial substrate 102 may also have a diameter depending on its final application of, for example, 300 mm, 200 mm, or any other practical diameter.

Figure 1B:
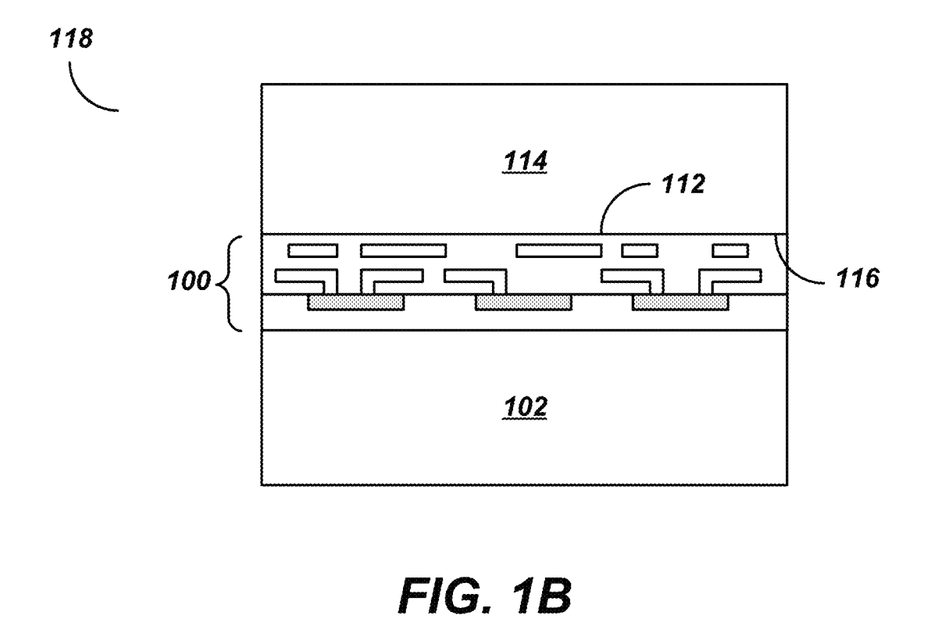
FIG. 1B illustrates a temporary substrate bonded to an exposed surface of the device layer opposite the initial substrate.

The device layer 100 may have an exposed surface 112, and this exposed surface 112 may be attached to a temporary substrate 114 to form a semiconductor structure 118, as illustrated in FIG. 1B. Embodiments may comprise selecting the temporary substrate 114 to comprise at least one of silicon, germanium, silicon germanium, silicon carbide, a III-V material or a II-VI material, glass, etc. In some embodiments, the initial substrate 102 and the temporary substrate 114 may comprise the same or essentially the same material. Such material matching of the initial substrate 102 and the temporary substrate 114 to one another may improve the processes for attaching the device layer 100 to the temporary substrate 114. For example, the coefficient of thermal expansion of the initial substrate 102 and the coefficient of thermal expansion of the temporary substrate 114 may be selected to be at least substantially the same value to prevent unwanted stresses during the attachment processes. In further embodiments, the difference between the coefficient of thermal expansion of the initial substrate 102 and the coefficient of thermal expansion of the temporary substrate 114 may be selected to be less than about 10 percent (10%).

The attachment of the device layer 100 to the temporary substrate 114 may be performed utilizing a bonding process. For example, the exposed surface 112 of the device layer 100 may be bonded to a surface 116 of temporary substrate 114. The bonding of device layer 100 to temporary substrate 114 may be carried out by bonding the device layer 100 and the temporary substrate 114 to one another by a molecular adhesion process at room temperature (between approximately 20° C. and approximately 30° C., for example.)

As known in the art, the principle of bonding by molecular adhesion, also referred to as "direct bonding," is based on the principle of bringing two surfaces (for example, the exposed surface 112 of the device layer 100 and the surface 116 of the temporary substrate 114) into direct contact, i.e., without the use of a specific bonding material (adhesive, wax, solder, etc.) therebetween. Such a bonding process requires that the surfaces to be bonded are sufficiently smooth and free of particles or contamination, and that they are brought sufficiently close to one another to make it possible to initiate contact, typically at a distance of less than a few nanometers. In this case, the attractive forces between the two surfaces 112, 116 are great enough to cause molecular adhesion (bonding induced by the sum of the attractive forces (van der Waals forces) of the electron interactions between the atoms or molecules of the two surfaces 112, 116 to be bonded).

Bonding by molecular adhesion may be initiated by the application of a pressure point on at least one position of the semiconductor structure 118 (of FIG. 1B) formed by the initial substrate 102, the device layer 100 and the temporary substrate 114. A bonding wave between the temporary substrate 114 and the device layer 100 is then propagated from the point where pressure was applied across an interface between the temporary substrate 114 and the device layer 100. The application of such a pressure is not, however, necessary to initiate the propagation of the bonding wave in all instances.

After bonding by molecular adhesion, annealing may be carried out on the semiconductor structure 118 at a moderate temperature (preferably less than or equal to 100° C.) in order to strengthen the bonding between the temporary substrate 114 and the device layer 100.

In further embodiments, the bonding process for attaching the surface 116 of the temporary substrate 114 to the exposed surface 112 of the device layer 100 may be performed under compression at room temperature. In yet further embodiments, the bonding process may be performed under compression at a temperature of less than or equal to 100° C.

In additional embodiments, a bonding layer (not shown) may be disposed between the temporary substrate 114 and the device layer 100. The bonding layer may be formed over one or both bonding surfaces of the device layer 100 and the temporary substrate 114, i.e., on exposed surfaces 112 and 116. The bonding layer may comprise one or more of a silicon oxide, silicon nitride or a silicon oxynitride. The bonding layer may be utilized to improve the reliability of the bonding processes for attaching the device layer 100 to the temporary substrate 114.

Upon attaching the temporary substrate 114 to the device layer 100, further processing may be utilized to form a high resistivity layer for improving RF performance of the plurality of devices 104 comprising device layer 100. The formation of the high resistivity layer may comprise removing a portion of the initial substrate 102 opposite the device layer 100. For example, referring to FIG. 1C, a portion of the initial substrate 102 opposite the device layer 100 may be removed by utilizing a thinning process to leave a remaining portion 102' of the initial substrate 102. The thinning of a portion of the initial substrate 102 may comprise one or more of an etching process, a grinding process and a polishing process (e.g., a chemical-mechanical polishing (CMP) process). For example, the initial substrate 102 may have an initial thickness of approximately less than 1000 microns, or even less than 800 microns, or in certain embodiments even less than 500 microns. A thinning process may be utilized to remove a portion of the exposed back surface of the initial substrate 102, thereby reducing the thickness of the initial substrate 102 to less than approximately 100 microns, or less than 20 microns, or in some embodiments even less than approximately 5 microns.

Figure 1C:
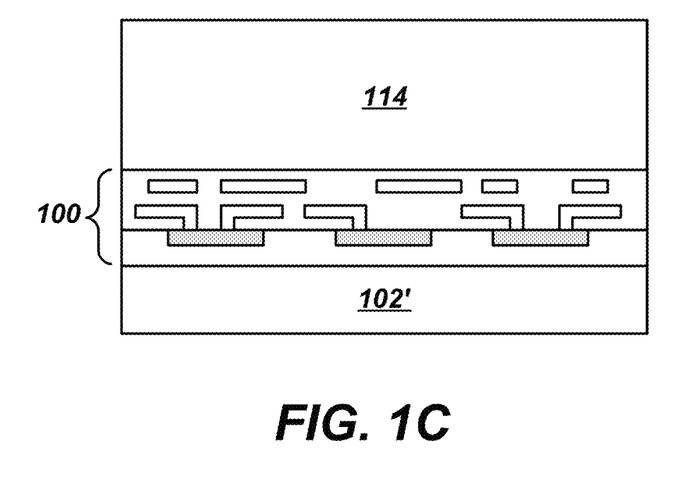
FIG. 1C illustrates the thinning of a portion of the initial substrate.
Figure 1D:
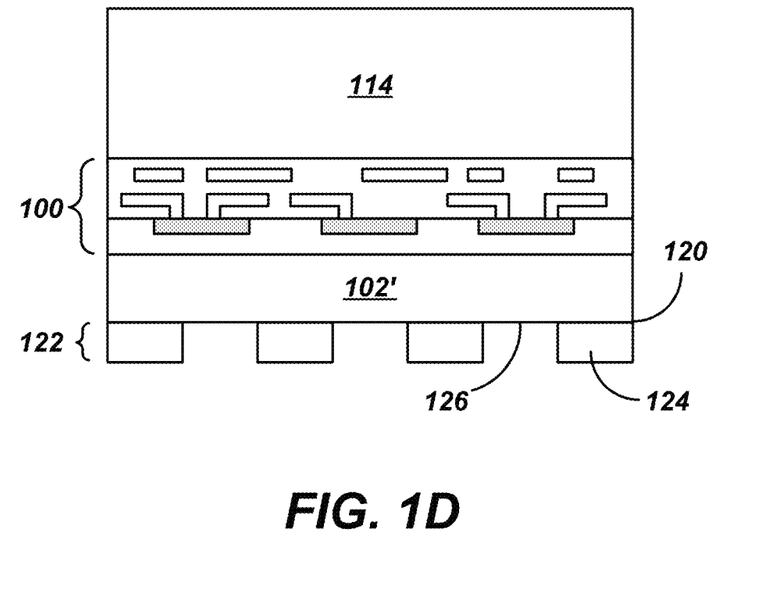
FIG. 1D illustrates forming a masking layer over the remaining portion of the initial substrate.

Referring to FIG. 1D, upon thinning of a portion of the initial substrate 102, a masking layer 122 may be formed over an exposed back surface 120 of the remaining portion 102' of the initial substrate 102 opposite the device layer 100. The masking layer 122 may be formed over the exposed back surface 120 of the remaining portion 102' of the initial substrate 102 using methods well known in the semiconductor industry, such as standard photolithography methods. For example, the masking layer 122 may comprise one or more of a polymer, a silicon oxide, a silicon nitride, or a metallic layer.

As illustrated in FIG. 1D, the masking layer 122 comprises a plurality of masking elements 124 and a plurality of mask openings 126 disposed over the back surface 120 of the remaining portion 102' of the initial substrate 102. An example embodiment of the layout of the masking layer 122 on the back surface 120 of the remaining portion 102' of the initial substrate 102 is shown in plan view in FIG. 1E. For example, as the illustrated example of FIG. 1E, each of the masking elements 124, which together define and comprise the masking layer 122, may have a selected geometry, such as rectangular, circular, or other suitable masking geometries. In some embodiments of the present disclosure, the total surface area of the plurality of masking elements 124 is less than seventy-five percent (75%) of the total area of the back surface 120 of the remaining portion 102' of the initial substrate 102. In other embodiments, the total surface area of the plurality of masking elements 124 is less than sixty percent (60%) of the total area of the back surface 120 of the remaining portion 102' of the initial substrate 102. In yet further embodiments, the total surface area of the plurality of masking elements 124 is less than fifty percent (50%) of the total area of the back surface 120 of the remaining portion 102' of the initial substrate 102.

Figure 1E:
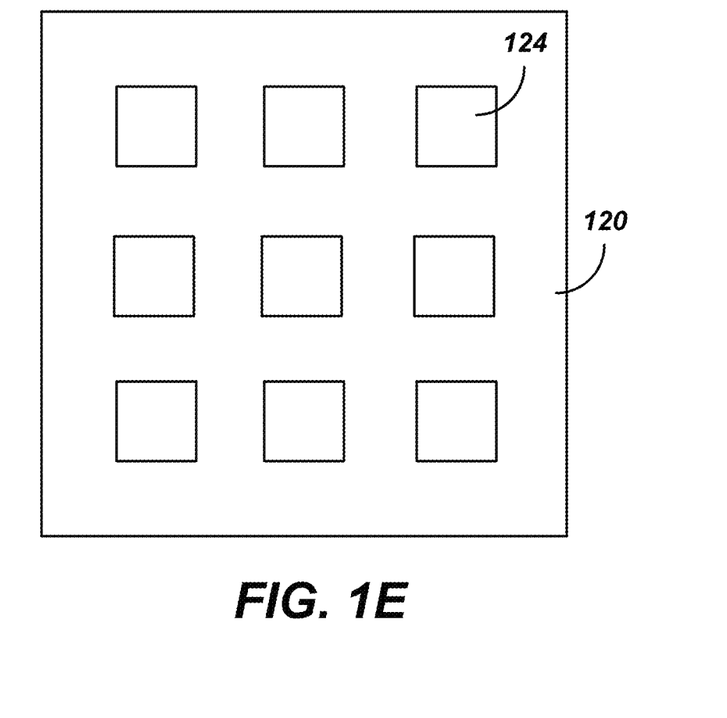
FIG. 1E illustrates a plan view of the remaining portion of the initial substrate with the masking layer thereon.
Figure 1F:
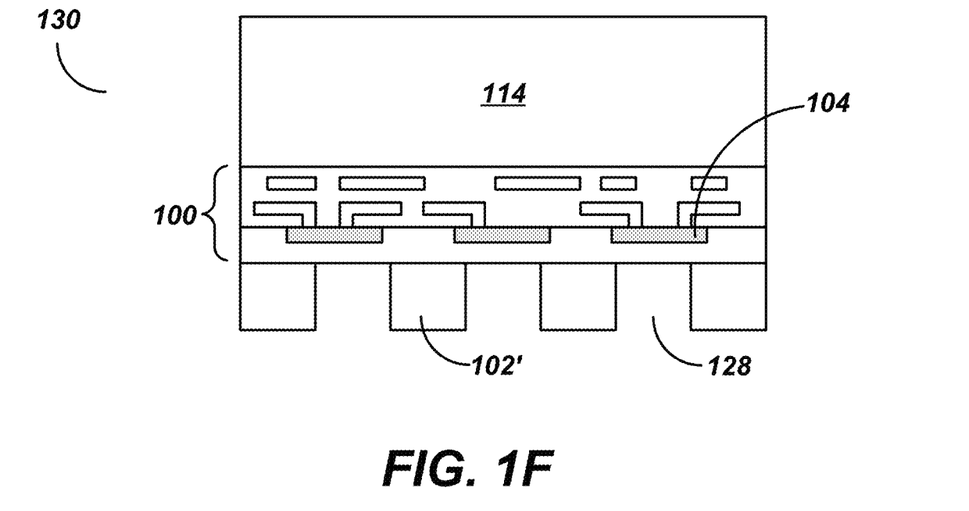
FIG. 1F illustrates forming a high resistivity layer by forming a plurality of vias through the remaining portion of the initial substrate.

Referring to FIG. 1F, upon forming the masking layer 122, an etching process may be performed to form a plurality of vias 128 extending through the unmasked back surface of the remaining portion 102' of the initial substrate 102 to form a semiconductor structure 130, after which the masking layer 122 may be removed. For example, an etching process may comprise one or more of a dry etch process (such as a plasma etching process) or a wet etch process (such as a wet acid etch). In certain embodiments of the present disclosure, the etching process may be performed until the plurality of vias 128 are of a depth of five (5) microns or more, twenty (20) microns or more, or even one hundred (100) microns or more. The etching process is halted prior to impinging on the device layer 100, thereby preventing any unwanted damage to the plurality of devices 104 of the device layer 100. Upon completion of the etching process, the masking layer 122 may be removed utilizing well known methods such as a chemical etching process or a solvent cleaning process.

Figure 1G:
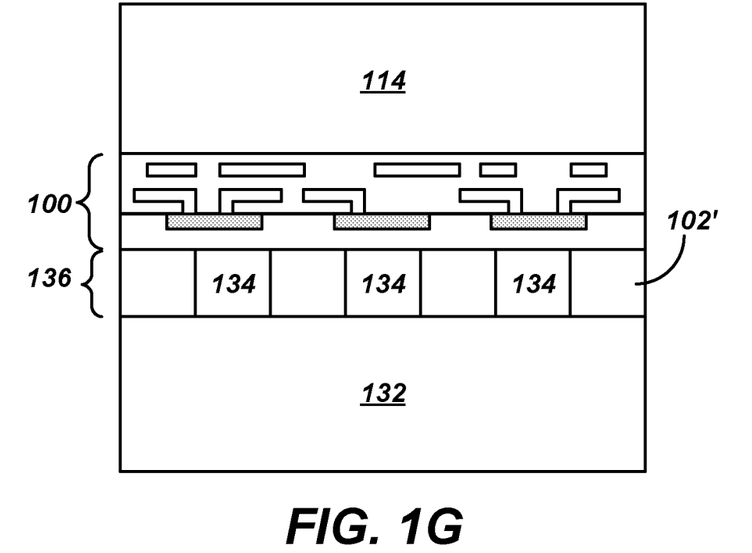
FIG. 1G illustrates attaching a final substrate to the high resistivity layer.

Referring to FIG. 1G, after forming the plurality of vias 128 extending through the remaining portion 102' of the initial substrate 102, a final substrate 132 may be attached over the plurality of vias 128 so as to form a plurality of cavities 134 between the final substrate 132 and the device layer 100. The plurality of cavities 134 and the remaining portion 102' of the initial substrate 102 form a high resistivity layer 136.

In greater detail, embodiments of the present disclosure may comprise selecting the final substrate 132 to comprise at least one of silicon, germanium, silicon germanium, silicon carbide, a III-V material or a II-VI material. In additional embodiments, the final substrate 132 may comprise one or more of a ceramic, a dielectric or an insulator. The final substrate 132 may further comprise a monocrystalline material or, alternatively, may comprise a polycrystalline or amorphous material. Additional embodiments may comprise selecting the final substrate 132 to exhibit a resistivity of between about ten (10) Ohm·cm and about one million (1,000,000) Ohm·cm.

The final substrate 132 may be attached over the plurality of vias 128 so as to form the plurality of cavities 134 by making contact with the remaining portion 102' of the initial substrate 102 using a bonding process, as previously described with reference to the bonding of the temporary substrate 114 to the device layer 100. In addition, as previously described, a bonding layer (not shown) may be formed over one or more of the final substrate 132 and the remaining portion 102' of the initial substrate 102 in order to improve the bonding process, for example, by molecular bonding as previously described in detail above.

The attachment of the final substrate 132 over the plurality of vias 128 extending through the remaining portion 102' of the initial substrate 102 forms a high resistivity layer 136, the resistivity layer 136 being disposed between the final substrate 132 and the device layer 100. The high resistivity layer 136 therefore comprises a plurality of cavities 134 and the remaining portion 102' of the initial substrate 102. In some embodiments, the attachment of the final substrate 132 over the plurality of vias 128 may be performed by a molecular bonding process such that the plurality of cavities 134 comprises a plurality of air gaps essentially comprising atmospheric air. In further embodiments of the present disclosure, a molecular bonding process may be utilized under differing gaseous atmospheres such that the plurality of cavities 134 may be filled with an atmosphere and pressure of choice inside the cavities 134.

The high resistivity layer 136 may be fabricated such that the high resistivity layer 136 has an average electrical resistivity of greater than approximately ten thousand (10,000) Ohm·cm, or greater than approximately one hundred thousand (100,000) Ohm·cm, or even greater than one million (1,000,000) Ohm·cm. The fabrication of the high resistivity layer 136 disposed between the final substrate 132 and the device layer 100 enhances performance, and may ensure optimal performance, of RF devices fabricated within the device layer 100.

Figure 1H:
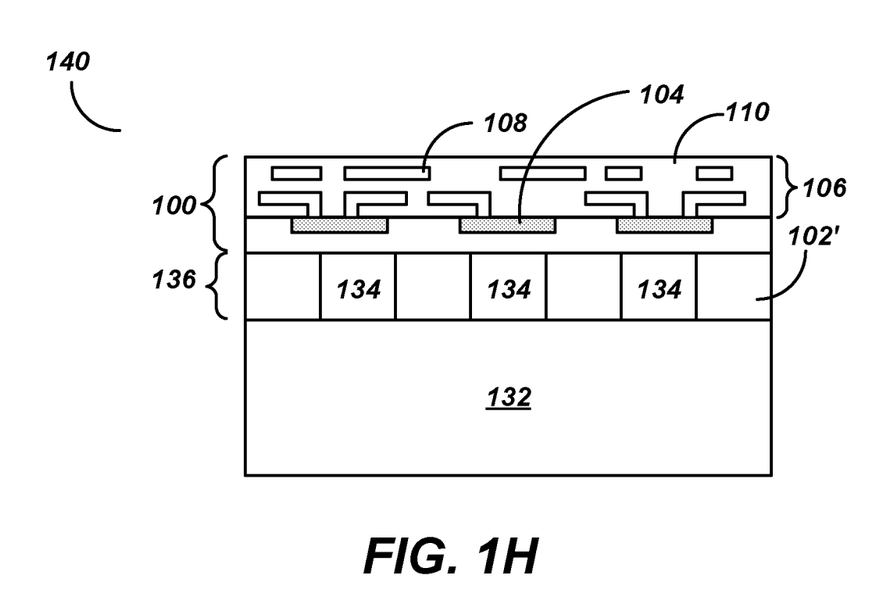
FIG. 1H illustrates removing the temporary substrate.

Upon fabrication of the high resistivity layer 136, embodiments of the present disclosure may proceed by the removal of the temporary substrate 114, as illustrated in FIG. 1H. The temporary substrate 114 may be removed by one or more of an etching, grinding, or polishing process. The removal process of the temporary substrate 114 is performed until the entire temporary substrate 114 has been removed, thereby re-exposing the device layer 100 and particularly exposing the interconnection layer 106 comprising the interlayer dielectric material 110 and conductive elements 108.

The embodiments of the present disclosure, as previously described, provide methods and structures for forming a high resistivity layer comprising a remaining portion of an initial substrate and a plurality of cavities. In additional embodiments of the present disclosure described below, the high resistivity layer may comprise a remaining portion of the initial substrate, as well as an additional high resistivity material formed thereover.

Figure 2A:
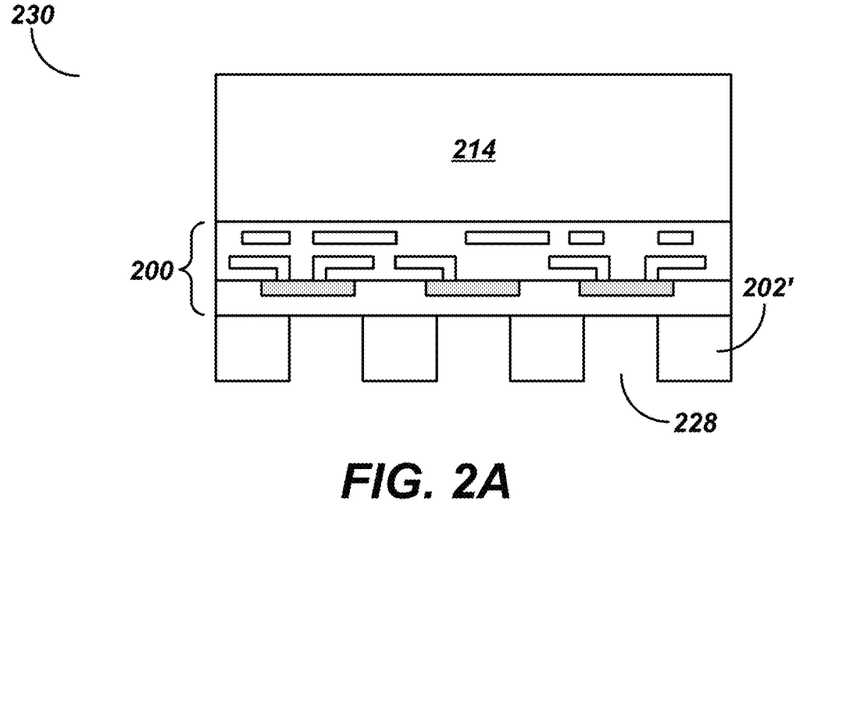
FIG. 2A illustrates a semiconductor structure including a temporary substrate, a device layer and a remaining portion of an initial substrate including a plurality of vias.

In further detail and with reference to FIG. 2A, a semiconductor structure 230 is formed that comprises a temporary substrate 214, a device layer 200, a remaining portion 202' of an initial substrate (not shown) and a plurality of vias 228 extending through the remaining portion 202' of the initial substrate. The semiconductor structure 230 of FIG. 2A is essentially the same semiconductor structure as semiconductor structure 130 of FIG. 1F, and may be formed using essentially the same methods as those previously described above in the formation of semiconductor structure 130 of FIG. 1F.

Figure 2B:
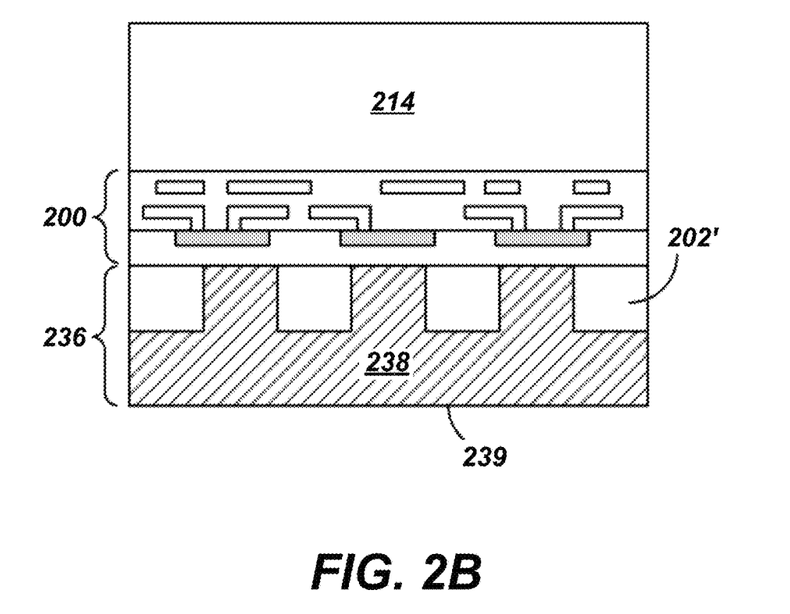
FIG. 2B illustrates forming a high resistivity layer by applying a high resistivity material over the plurality of vias.

Having fabricated semiconductor structure 230 of FIG. 2A, embodiments of the present disclosure may proceed by formation of a high resistivity layer 236 comprising the remaining portion 202' of the initial substrate and an additional high resistivity material 238. In some embodiments of the present disclosure, the additional high resistivity material 238 may be disposed over the remaining portion 202' of the initial substrate and may also fill the plurality of vias 228, as illustrated in FIG. 2B.

A number of processes may be utilized for the formation of the high resistivity material 238. For example, one or more of a deposition process (for example, chemical vapor deposition, physical vapor deposition, etc.) or a spin-on process may be utilized in the formation of the high resistivity material 238. The high resistivity material 238 may be formed utilizing a conformal formation processes, and subsequently planarized to form an exposed planar high resistivity surface 239. The planarization process for forming the high resistivity surface 239 may be performed utilizing one or more of a chemical polishing process, a mechanical grinding process, or a chemical etching process (e.g., a CMP process).

In some embodiments of the present disclosure, the high resistivity material 238 may comprise one or more of dielectric materials, such as, for example, silicon oxide, silicon nitride, high resistivity polymer, polyimide, or a ceramic glue. The high resistivity material 238 may comprise a high resistivity material with an electrical resistivity value of greater than approximately ten thousand (10,000) Ohm·cm, greater than approximately one hundred thousand (100,000) Ohm·cm, or even greater than one million (1,000,000) Ohm·cm.

Figure 2C:
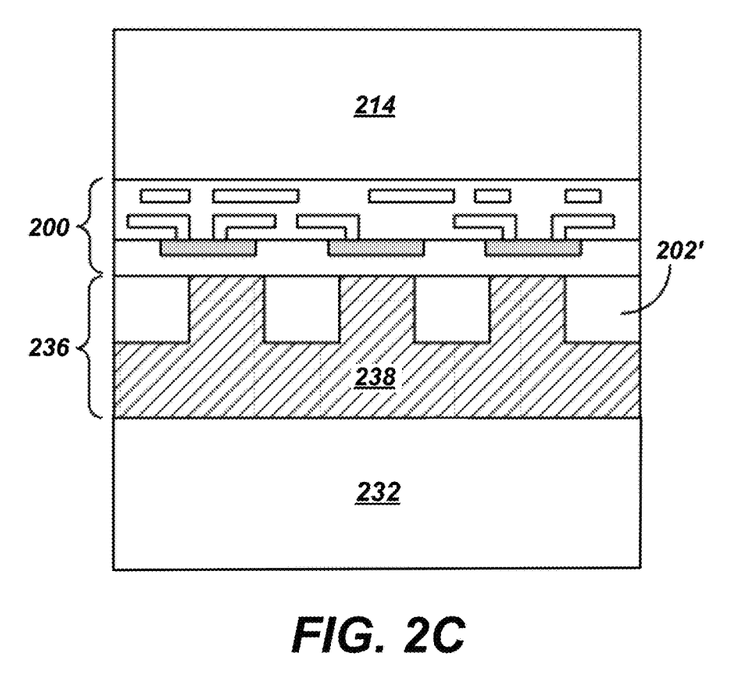
FIG. 2C illustrates attaching a final substrate to the high resistivity layer.

Upon formation of the high resistivity layer 236, a final substrate 232 may be attached to the high resistivity layer 236, as illustrated in FIG. 2C. The attachment of the high resistivity layer 236 to the final substrate 232 may be performed utilizing a bonding process as previously described with reference to the bonding of the temporary substrate 114 to the device layer 100. In addition, as previously described, a bonding layer (not shown) may be formed over one or more of the final substrate 232 and the high resistivity layer 236 in order to improve the bonding process, for example, by molecular bonding, as previously described in detail above.

Figure 2D:
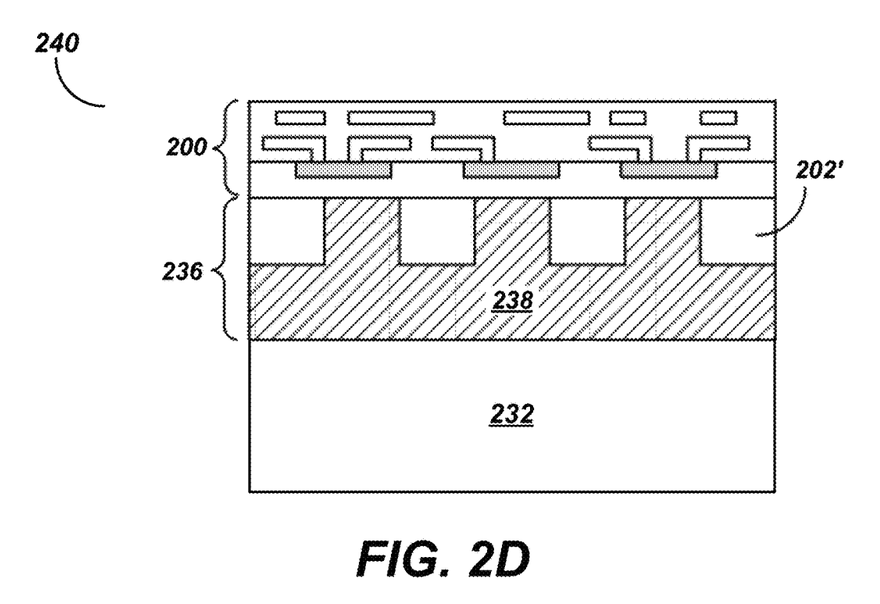
FIG. 2D illustrates removing the temporary substrate from the semiconductor structure of FIG. 2C.

Upon fabrication of the high resistivity layer 236, embodiments of the present disclosure may proceed by removal of the temporary substrate 214 as illustrated in FIG. 2D. The temporary substrate 214 may be removed by one or more of an etching, grinding, or polishing process, as previously mentioned. The removal process of the temporary substrate 214 is performed until the entire temporary substrate 214 has been removed, thereby re-exposing the device layer 200 and particularly exposing an interconnection layer comprising an interlayer dielectric and conducting elements.

EXAMPLE 1

According to a first exemplary implementation (described with reference to FIGS. 1A to 1H), a device layer 100 comprising RF switches is produced on an initial substrate 102 made of silicon, with a resistivity of 5 Ohm·cm, a diameter of 300 mm and a thickness of 800 microns (FIG. 1A).

A temporary substrate 114 made of silicon, with a diameter of 300 mm and a thickness of 800 microns, is assembled by molecular adhesion bonding to the exposed surface of the device layer 100. Prior to the bonding, the exposed surface of the device layer 100 may have undergone chemical-mechanical planarization followed by cleaning in order to give the surface the flatness, low level of roughness and cleanliness required with a view to bonding by molecular adhesion. The temporary substrate 114 may, in turn, have also undergone microelectronic cleaning (for instance, by ozone+RCA) in order to provide the temporary substrate 114 the proper surface properties. An assembled semiconductor structure 118 (FIG. 1B) is thus obtained. The rear side of the initial substrate 102 (i.e., the side opposite that bearing the device layer 100) is subsequently thinned, for example, by mechanical grinding and subsequently by chemical-mechanical polishing (CMP) until a residual thickness of 5 microns is achieved (FIG. 1C). Prior to the thinning stage, the assembled semiconductor structure 118 may undergo heat treatment, at around 100° C.-150° C., for example, in order to enhance the bonding forces at the interface between the temporary substrate 114 and the device layer 100.

A photolithography stage subsequently serves to apply a masking layer 122 to the thinned rear side of the initial substrate 102, defining masked areas 124 and unmasked areas 126 (FIGS. 1D and 1E). By way of example, the masked areas 124 are squares with side dimensions of 10×20 microns. The surface area of the masked areas 124 is less than 50% of the total surface area of the thinned side of the initial substrate 102, i.e., 40%, for example. A chemical etching stage is subsequently used to etch the unmasked areas 126 of the initial substrate 102, in order to form vias 128 (FIG. 1F). The masking layer 122 is removed.

A final substrate 132 consisting of aluminum nitride, of a thickness of 500 microns, for example, is subsequently prepared with a view to its assembly on the thinned rear side of the initial substrate 102. Preparation of the surfaces to be assembled may comprise plasma treatment (under oxygen or nitrogen) capable of activating the surfaces and of providing the subsequent bonding high adhesion energy at low temperatures. Assembly is performed using a direct bonding technique, under a controlled atmosphere. By way of example, the atmosphere of the bonding chamber may be air at atmospheric pressure or a gas (for example, nitrogen or argon, or another gas) at a selected pressure. Following assembly (FIG. 1G), the high resistivity layer 136 is formed: it consists of a remaining portion 102' of the initial substrate 102 and cavities 134, filled with air or a selected gas, at a chosen pressure. Low-temperature heat treatment (on the order of 100° C., given the major difference between the thermal expansion coefficients of respective assembled temporary and final substrates 114, 132)) may be performed in order to enhance the bonding energy between the thinned side of the initial substrate 102 and the final substrate 132.

The last stage involves removal of the temporary substrate 114. This last stage can be performed either by removing the temporary substrate 114 by mechanical grinding and chemical etching, or preferentially by disassembly, i.e., by applying mechanical stress at the bonding interface between the temporary substrate 114 and the device layer 100.

Structure 140, thus obtained, gives good RF performance to the switches included in the layer of devices 100, owing to the presence of the final substrate 132 with electrical insulation properties more favorable than those of the initial substrate 102. Furthermore, the remaining portion 102' of the initial substrate 102 does not impair the performances of the devices by creating a conduction path, owing to formation of the high resistivity layer 136.

The manufacturing technique, according to the present disclosure, thus makes it possible to use an initial silicon substrate, instead of an SOI substrate, which is more expensive, and, following a double transfer of layer and manufacture of the high resistivity layer 136, to obtain a structure, the properties of which are suitable for RF applications.

EXAMPLE 2

According to a second exemplary implementation (described with reference to FIGS. 2A to 2D), a device layer 200 comprising RF switches is produced on an initial substrate made of silicon, with a resistance of 30 Ohm·cm, a diameter of 300 mm and a thickness of 800 microns. A temporary substrate 214 made of silicon, with a diameter of 300 mm and a thickness of 800 microns, is assembled by direct bonding to the exposed surface of the device layer 200. Prior to the bonding, the exposed surface of the device layer 200 may have undergone chemical-mechanical planarization followed by cleaning in order to give the surface the flatness, low level of roughness and cleanliness required with a view to bonding by molecular adhesion. The temporary substrate 214 may, in turn, have also undergone microelectronic cleaning (for instance, by ozone+RCA) in order to provide the temporary substrate 214 the correct surface properties. The rear side of the initial substrate (i.e., the side opposite that bearing the device layer 200) is subsequently thinned, for example, by mechanical grinding and subsequently by chemical-mechanical polishing until a residual thickness of 20 microns is achieved.

A photolithography stage subsequently serves to apply to the thinned rear side (remaining portion 202') of the initial substrate, a masking layer, defining masked areas and unmasked areas. By way of example, the masked areas are rectangles with side dimensions of 10×20 microns. The surface area of the masked areas is less than 75% of the total surface area of the thinned side of the initial substrate, i.e., 55%, for example. A chemical etching stage is subsequently used to etch the unmasked areas of the remaining portion 202' of the initial substrate, in order to form vias 228 (FIG. 2A). The masking layer is removed.

A layer of high resistivity material 238 is subsequently deposited in the vias 228, so as to fill the vias 228 (i.e., a thickness at least equal to the residual thickness of the remaining portion 202' of the initial substrate) and, if appropriate, on the remaining portion 202' of the initial substrate (as illustrated in FIG. 2B). This high resistivity material will, for example, be silicon oxide or, alternatively, it may be made of high resistivity (i.e., preferably greater than 10,000 Ohm·cm) polymer. It will subsequently be possible to prepare the exposed surface 239 of the high resistivity material 238 with a view to direct bonding, for example, by application of chemical-mechanical planarization followed by RCA cleaning.

A final substrate 232 made of glass, of a thickness of 500 microns, for example, is subsequently prepared with a view to its assembly on the thinned rear side of the initial substrate (remaining portion 202'). Preparation of the surfaces to be assembled may comprise a plasma treatment (under oxygen or nitrogen) capable of activating the surfaces and of providing the subsequent bonding high adhesion energy at low temperatures. Assembly is performed using a direct bonding technique. Following assembly (FIG. 2C), the high resistivity layer 236 is formed: the high resistivity layer 236 consists of the remaining portion 202' of the initial substrate and the high resistivity material 238. Low-temperature heat treatment (on the order of 100° C., given the major difference between the thermal expansion coefficients of respective assembled temporary and final substrates 214, 232) may be performed in order to enhance the bonding energy between the thinned side of the initial substrate and the final substrate 232.

The last stage involves removal of the temporary substrate 214 (FIG. 2D). This last stage can be performed either by removing the temporary substrate 214 by mechanical grinding and chemical etching, or preferentially by debonding, i.e., by applying mechanical stress for example, at the bonding interface between the temporary substrate 214 and the layer of devices 200.

Semiconductor structure 240, thus obtained, gives good RF performances to the switches included in the device layer 200 owing to the presence of the final substrate 232 with electrical insulation properties more favorable than those of the initial substrate. Furthermore, the residual thickness of the remaining portion 202' of the initial substrate does not impair the performances of the devices by creating a conduction path, owing to formation of the high resistivity layer 136.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the disclosure. Such modifications and embodiments are also intended to fall within the scope of the appended claims.

What is claimed is:

1. A method of forming a semiconductor structure comprising:
    forming a device layer on an initial semiconductor substrate;
    attaching a first surface of the device layer to a temporary substrate;
    forming a high resistivity layer with an average electrical resistivity greater than approximately 10,000 Ohm·cm, wherein forming the high resistivity layer comprises:
        removing a portion of the initial substrate by thinning, thus leaving a remaining portion of the initial substrate, and
        forming a plurality of vias extending through the remaining portion of the initial substrate;
    attaching a final substrate to the high resistivity layer; and
    removing the temporary substrate.

2. The method of claim 1, wherein forming a plurality of vias extending through a remaining portion of the initial substrate further comprises:
    forming a masking layer over an exposed surface of the remaining portion of the initial substrate; and
    etching vias through an unmasked remaining portion of the initial substrate.

3. The method of claim 2, wherein the masking layer comprises a plurality of masking elements, the method further comprising selecting the total surface area of the plurality of masking elements to be less than seventy-five percent of the total surface area of the exposed surface of the remaining portion of the initial substrate.

4. The method of claim 3, wherein attaching the final substrate to the high resistivity layer comprises attaching the final substrate to the plurality of vias forming a plurality of cavities between the final substrate and the device layer.

5. The method of claim 3, further comprising forming a high resistivity material over the plurality of vias.

6. The method of claim 1, wherein attaching the final substrate to the high resistivity layer comprises attaching the final substrate to the plurality of vias forming a plurality of cavities between the final substrate and the device layer.

7. The method of claim 1, further comprising forming a high resistivity material over the plurality of vias.

8. The method of claim 7, further comprising selecting the high resistivity material to have an electrical resistivity greater than 10,000 Ohm·cm.

9. The method of claim 7, further comprising selecting the high resistivity material to comprise at least one of a silicon oxide, a silicon nitride, a high resistivity polymer, a polyimide, or a ceramic glue.

10. A semiconductor structure, comprising:
    a final substrate; and
    a high resistivity layer disposed over the final substrate, the high resistivity layer exhibiting an average electrical resistivity greater than approximately 10,000 Ohm·cm, the high resistivity layer comprising:
        a remaining portion of an initial semiconductor substrate; and
        a plurality of vias extending through the remaining portion of the initial substrate; and
    a radio frequency electronic device layer disposed over the high resistivity layer.

11. The semiconductor structure of claim 10, wherein the high resistivity layer comprises the remaining portion of the initial substrate and a plurality of cavities.

12. The semiconductor structure of claim 10, wherein the high resistivity layer further comprises a high resistivity material disposed in the plurality of vias.

13. The semiconductor structure of claim 12, wherein the high resistivity material comprises one or more of a silicon oxide, a silicon nitride, a high resistivity polymer, a polyimide, or a ceramic glue.

* * * * *